(12) United States Patent
Reid et al.

(10) Patent No.: US 8,054,593 B2
(45) Date of Patent: Nov. 8, 2011

(54) APPARATUS AND METHOD FOR MEASURING LOAD CURRENT USING A GROUND FAULT SENSING TRANSFORMER

(76) Inventors: Paul A. Reid, Cedar Rapids, IA (US); Robert Erger, Swisher, IA (US)

( * ) Notice: Subject to any disclaimer, the term of this patent is extended or adjusted under 35 U.S.C. 154(b) by 394 days.

(21) Appl. No.: 12/344,864

(22) Filed: Dec. 29, 2008

(65) Prior Publication Data

US 2010/0169034 A1 Jul. 1, 2010

(51) Int. Cl.
*H02H 3/00* (2006.01)
*G01R 33/14* (2006.01)

(52) U.S. Cl. .............. 361/42; 361/45; 361/57; 361/63; 324/222

(58) Field of Classification Search ............ 702/64, 702/58, 57, 35, 65; 361/42, 45, 57, 63; 700/170
See application file for complete search history.

(56) References Cited

U.S. PATENT DOCUMENTS

| 3,614,533 | A | * | 10/1971 | Douglas et al. | ............... 361/44 |
| 7,079,365 | B2 | * | 7/2006 | Brown et al. | ................ 361/42 |
| 7,193,827 | B2 | | 3/2007 | Reid et al. | |

* cited by examiner

*Primary Examiner* — Mohamed Charioui
*Assistant Examiner* — Manuel Rivera Vargas

(57) ABSTRACT

A circuit that includes a single grounded fault sensing transformer coupled to a resonant circuit that produces an output signal used by a microcontroller to determine a load current flowing through at least two conductors passing through the center of the sensing transformer. The microcontroller pings the resonant circuit, causing an impulse disturbance at the output signal, and the microcontroller calculates the inductance component of the resonant circuit based on the frequency of the decaying output signal. The microcontroller calculates the resistive core loss as a function of a known resistance of the resonant circuit, a known capacitance of the resonant circuit, the calculated inductance, and the determined rate of decay of the output signal. The calculated resistive core loss is compared to a table or to a polynomial function that characterizes known resistive core losses with known load currents to determine the load current corresponding to the calculated resistive core loss.

21 Claims, 4 Drawing Sheets

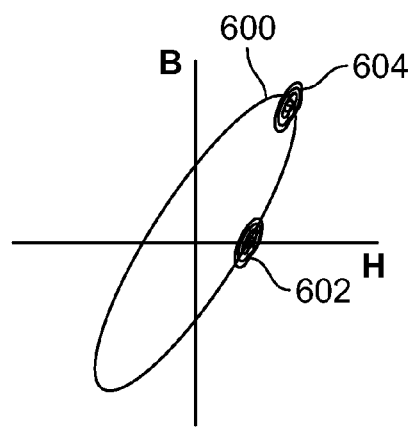
FIG. 6
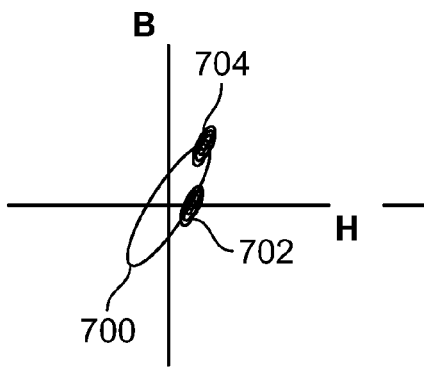 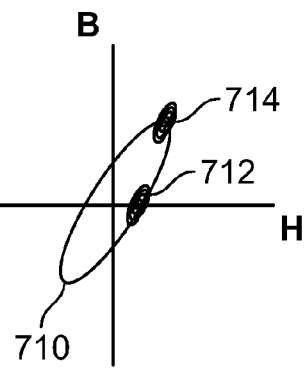 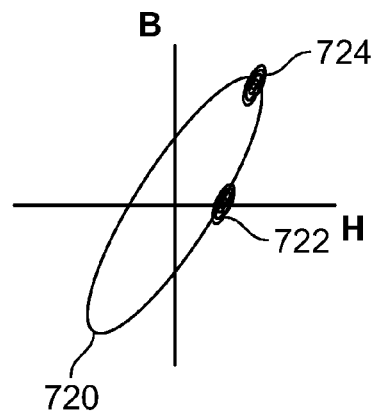
FIG. 7A   FIG. 7B   FIG. 7C
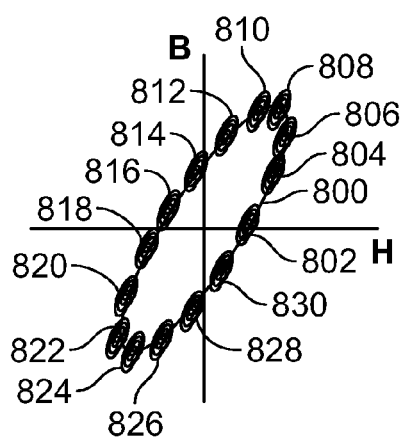
FIG. 8

APPARATUS AND METHOD FOR MEASURING LOAD CURRENT USING A GROUND FAULT SENSING TRANSFORMER

FIELD OF THE INVENTION

Aspects disclosed herein relate generally to current sensors, and, more particularly, to a method for measuring load current using a ground fault sensing transformer.

BACKGROUND

Measuring load current consumed by a load connected to a circuit is useful for metering analysis. One way to measure accurately a range of load currents is to couple a current sensor (typically a current transformer) to a conductor carrying the load current, and convert the sensor output into a representation of the load current. Current transformers are bulky as they are shaped like a toroid and are positioned so that the load conductor passes through an opening in the toroid-shaped core. A ground fault detector already includes a ground fault sensing transformer, so to measure load current, a second transformer is needed. Eliminating the need for a bulky second current transformer would be beneficial. In addition, load shifts caused by variations in the windings of the ground fault sensing transformer can permit the sensed ground fault current to reach too high a value. Eliminating these load shifts would be beneficial.

What is needed, therefore, is an apparatus and method for measuring load current using a ground fault sensing transformer without the use of an external sensor. The present disclosure is directed to addressing these and other needs.

BRIEF SUMMARY

The present disclosure describes a circuit that measures load current via a single ground fault sensing transformer without the need for an external sensor for measuring load current. The circuit exploits the fact that the localized magnetic field intensities in a ferrite core of the ground fault sensing transformer are not uniform when load current passes through the conductors that pass through the center of the transformer. As a result, the non-uniform magnetic field produces localized changes in flux densities over a cycle of load current that can be detected by disturbing a resonant circuit and measuring the frequency and losses in the resulting decaying sinusoidal signal produced by the "ringing" resonant circuit. The parallel resonant circuit includes an inductive component corresponding to the current transformer, a capacitive component corresponding to a known capacitance, and a resistive component corresponding to a known resistance, a resistive core loss associated with the core, and a resistive loss associated with the primary loop of the transformer, which can be ignored in the absence of a grounded-fault condition.

The resonant circuit is "pinged" by a microcontroller that outputs a ping start signal to initiate a ringing of the resonant circuit. The inductive component of the resonant circuit is calculated by the microcontroller from the frequency of the decaying output signal of the resonant circuit. The capacitance is known, leaving only the unknown resistive core loss to be solved for. Once the resistive loss has been calculated, the load current can be calculated by comparing the calculated resistive loss against a table or a polynomial function characterizing known resistive losses versus known load currents. By sampling the resistive losses repeatedly over a cycle of load current, a representation of the load current is produced without the use of an additional sensor. The calculated load currents can be used for metering or for tripping the circuit breaker in response to an excessive level of load current.

The foregoing and additional aspects of the present disclosure will be apparent to those of ordinary skill in the art in view of the detailed description of various embodiments, which is made with reference to the drawings, a brief description of which is provided next.

BRIEF DESCRIPTION OF THE DRAWINGS

The foregoing and other advantages of the invention will become apparent upon reading the following detailed description and upon reference to the drawings.

FIG. 6 is a B-H curve generated by the magnetic field in the core material superimposed with two smaller B-H curves representing two resonant circuit signals;

FIGS. 7A-7C are B-H curves generated by increasingly higher levels of load current over one full cycle; and FIG. 8 is a B-H curve generated by the magnetic field in the core material superimposed with 16 smaller B-H curves representing 16 pings, or about one per millisecond, over a full cycle of AC load current.

Figure 1:
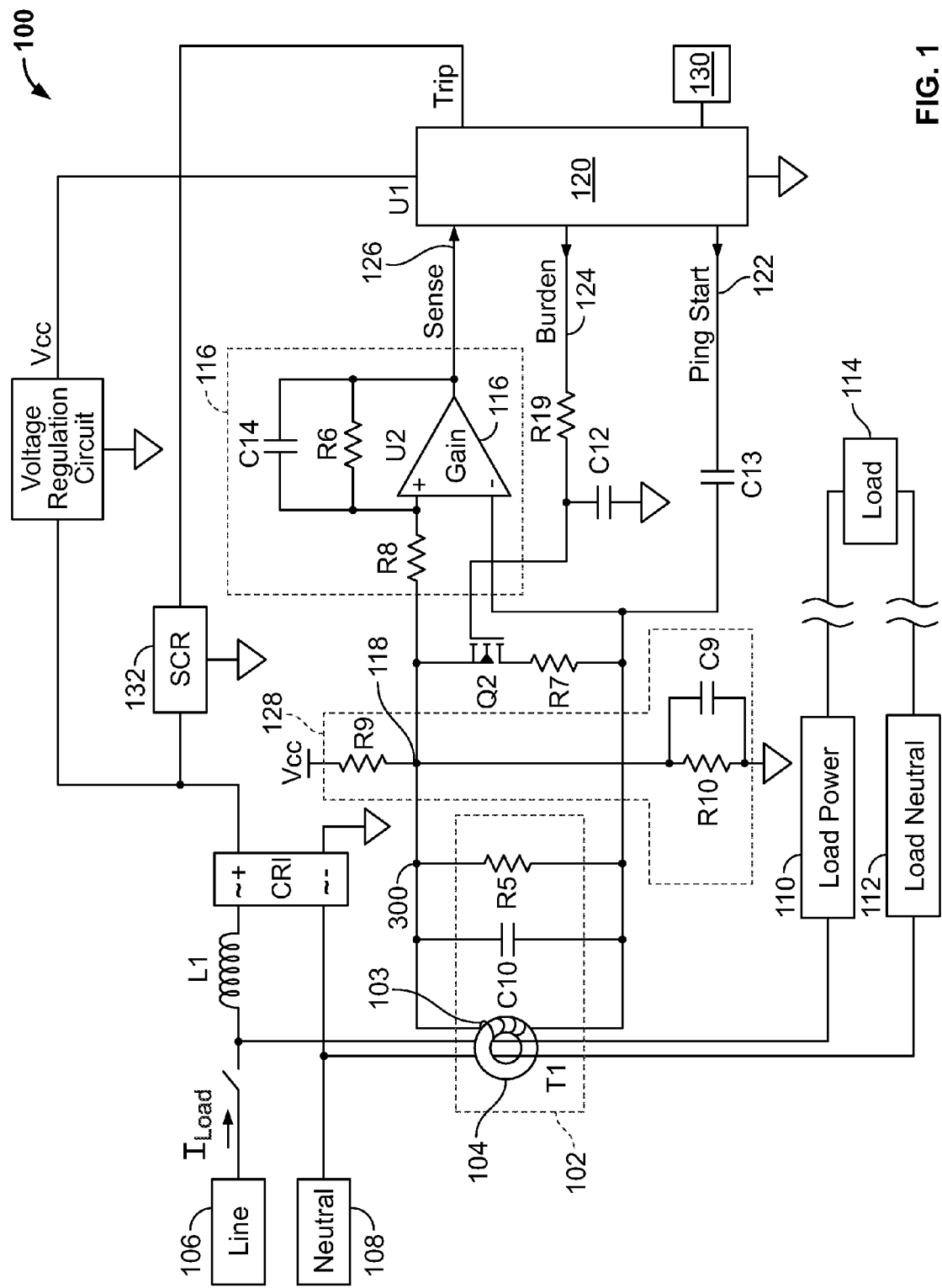
FIG. 1 is a functional circuit diagram of an exemplary load-current detection circuit.

While this disclosure is susceptible to various modifications and alternative forms, specific embodiments have been shown by way of example in the drawings and will be described in detail herein. It should be understood, however, that this disclosure is not intended to be limited to the particular forms disclosed. Rather, this disclosure is intended to cover all modifications, equivalents, and alternatives falling within the spirit and scope of the disclosure as defined by the appended claims.

DETAILED DESCRIPTION

FIG. 1 illustrates a functional block diagram of a load-current detection circuit 100 that includes a resonant circuit 102 operatively coupled to a microcontroller 120. The resonant circuit 102 forms a parallel RLC circuit having resistive, inductive, and capacitive components, as modeled in FIG. 2. The capacitive component is supplied by the total parallel capacitance in the circuit 100, including C10, and the inductive component represents the inductance associated with a ground fault sensing transformer 104 having a conventional primary loop comprising a toroid ferrite core and a secondary winding 103. At least two non-concentric load conductors (line and neutral) 106, 108 pass through the central opening of the sensing transformer 104 (see FIG. 5). The resistive component of the resonant circuit 102 includes a known resistance of a resistor R5, connected in parallel with the capacitor C10, a resistive loss associated with the ferrite core of the sensing transformer 104, referred to herein as $R_{core}$ (resistive core loss), and a resistive loss associated with the primary loop, referred to herein as $R_s$ (primary loop loss).

A load 114 is connected across the load conductors 106, 108. The load conductors 106, 108 carry load current that is balanced such that the net current flowing through the center of the sensing transformer 104 is substantially zero when no ground fault condition exists. Thus, the sensing transformer 104 produces an output only if a ground fault current exists, creating a misbalance of current in the load conductors 106, 108. The output of the sensing transformer 104 (i.e., at the secondary winding 103) is proportional to the magnitude of the current of the ground fault. The sensing transformer 104 can also be referred to as a ground fault sensor or a ground fault current transformer.

As mentioned above, the resonant circuit 102 has a known resistance, R5, and the known capacitance in the circuit 100, including capacitor C10. An impulse disturbance having a predetermined voltage amplitude is applied by the microcontroller 120 to the resonant circuit 102 via a ping start signal 122, and the microcontroller 120 measures one or more characteristics of the decaying sinusoidal signal. The microcontroller 120 includes a conventional analog-to-digital converter (not shown) to produce digital samples representing the output signal of the resonant circuit 102. One of the characteristics calculated by the microcontroller 120 is the frequency of the decaying signal, from which the inductance value associated with the secondary winding 103 of the sensing transformer 104 is determined by the microcontroller 120, as described in the equations below. It should be noted that the resistive loss associated with the primary loop (primary loop loss), $R_s$, is essentially an open circuit under normal (no fault) conditions, leaving only the known resistance value of R5 and the unknown core loss value $R_{core}$ to be solved for. If there is any connection between ground and neutral and even a small amount of load current, the microcontroller 120 will detect a grounded-neutral fault in the form of a ground fault and trip, thus the resistance associated with the primary loop ($R_s$) is essentially removed from the resonant circuit 102 when no ground or grounded-neutral fault condition is present.

The microcontroller 120 subtracts the known resistance value, R5, leaving only the core loss value, $R_{core}$. The microcontroller 120 calculates the load current, $I_{Load}$, based on the core loss value, $R_{core}$, as described in more detail below. The microcontroller 120 repeats these calculations at a sampling rate to approximate the time-varying load current signal. Under normal conditions when the current through the load conductors is balanced, because the non-concentric load conductors 106, 108 passing through the sensing transformer 104 generate localized magnetic fields, the known characteristic of core loss that varies with magnetic field intensity can be exploited to the sample the load current, $I_{Load}$, without any additional sensors for separately sensing the load current. The localized magnetic fields generate voltages on the secondary winding 103 that cancel out around the outer circumference of the toroid ferrite core 504 (FIG. 5) of the sensing transformer 104. It is the localized higher field intensities that affect the total resistive loss of the core, $R_{core}$. As long as the configuration of the load conductors 106, 108 passing through the ferrite core is known and the ferrite core 504 has a known loss that varies with magnetic field intensity, the load current $I_{Load}$ can be sampled as disclosed herein.

As mentioned above and still referring to FIG. 1, the microcontroller 120 controls a voltage amplitude of an impulse disturbance that is applied the to resonant circuit 102, causing it to oscillate and decay according to a decay factor at a rate that is proportional to R5 and the resistive loss of the core, $R_{core}$. The microcontroller 120 initiates the impulse disturbance via a ping start signal 122 outputted by the microcontroller 120. A burden control signal 124 is outputted by the microcontroller 120 and controls whether the burden resistor R7 is removed from the circuit 100 for reasons explained below. To cause an impulse disturbance on the resonant circuit 102, the microcontroller 120 transitions the burden control signal output 124 from high to low, which turns off the transistor Q2, removing the burden resistor R7 from the circuit 100. With the burden resistor R7 switched out of the circuit 100, the secondary winding 103 of the sensing transformer 104 and the circuit capacitance create a resonate circuit with a small amount of damping provided by the high-impedance burden resistor R5. The microcontroller 120 initiates the impulse disturbance via the ping start signal 122, causing an oscillating signal at a particular frequency that decays a particular rate.

The purpose of the burden resistor R7, when it is connected to the circuit 100, is to allow the microcontroller 120 to sense ground faults by loading down the secondary winding 103 of the ground fault sensing transformer 104 so that it acts like a current transformer. To measure load current, therefore, R7 needs to be disconnected from the circuit 100. In other words, when R7 is connected, the transformer 104 behaves like a current transformer and ground faults can be detected; when R7 is disconnected and the ping start signal 122 is applied, the resonant circuit 102 begins to oscillate or "ring" and grounded-neutral faults can be detected and load currents can be measured.

A bias voltage resistor divider circuit 128 formed by the resistors R9 and R10 produces a voltage, $V_{ref}$, at node 118 that is substantially half of $V_{CC}$, which is generated by the voltage regulation circuit. This ensures that the zero level of the output of the resonant circuit 102 sits halfway between the rails of the A/D converter input 126 of the microcontroller 120 to facilitate envelope detection.

An amplifier circuit 116 amplifies the decaying oscillating output of the resonant circuit 102 in response to the ping start signal 122 for ranging the output for the A/D converter input 126 of the microcontroller 120. The amplifier circuit 116 includes a gain amplifier U2, resistors R6 and R8, and the capacitor C14.

The microcontroller 120 can also be programmed to detect grounded-neutral fault conditions using conventionally known techniques, such as described in commonly assigned U.S. Pat. Nos. 7,079,365 and 7,193,827. The microcontroller 120 causes the burden resistor R7 to be switched back into the circuit 100 by applying a high output to the burden control signal 124, stopping the resonant circuit 102 from oscillating. As disclosed in U.S. Pat. No. 7,193,827, the microcontroller is responsive to the output signal produced by the sensing transformer 104 and initiates a trip signal upon detection of a ground-fault or a grounded-neutral fault condition in the circuit 100. The microcontroller 120 is programmed to detect ground-fault conditions during spaced time intervals based on the output signal produced by the sensing transformer 104. The microcontroller 120 is further programmed to detect grounded-neutral conditions during intervening time intervals between the spaced time intervals. A single analog memory circuit 130 operable with both full-wave and half-wave power supplies provides a timing function to control the spaced time intervals and the intervening time intervals. The memory circuit 130 also provides a memory function set in response to detection of a ground fault or grounded-neutral condition to resume a circuit trip if power is temporarily lost before a circuit interrupter activates. The circuit interrupter interrupts current flow in the ungrounded load conductor 106 in response to the trip signal being outputted from the microcontroller 120. The circuit interrupter conventionally includes a silicon-controlled rectifier (SCR) 132 or other electronic switching device and a trip solenoid L1 for disconnecting the line current from the circuit 100. Advantageously, the same circuit 100 for detecting grounded-neutral conditions can also be used to calculate load currents.

The microcontroller 120 includes at least the following measurement or detection modes: load current, ground fault, and grounded-fault. The microcontroller 120 can cycle through these modes by pinging the resonant circuit 102 and switching the burden resistor R7 in and out of the circuit 100 by toggling the burden control signal output 124, checking for ground faults and grounded-neutral faults while also calculating a sampled representation of the load current when no fault condition is present. To initiate a load current reading, the microcontroller 120 initiates a "ping" of the ground fault sensing transformer 104 at a defined time by setting the burden control signal 124 low (0V) to remove the burden resistor, R7, from the circuit 100. The microcontroller 120 rapidly switches the ping start signal 122 from one power supply rail to the other (high to low, or low to high). This rapid change in voltage causes a pulse of current to flow through a series of capacitors including C13, C10, and C9, leaving a net voltage across C10 approximated by the following equation:

$$V_0 \approx \frac{\Delta V * C13 * C9}{C9 * C10 + C13 * C10 + C13 * C10} \quad \text{(Equation 1)}$$

Where $\Delta V$ is the change in voltage at the pin of the microcontroller 120 corresponding to the ping start signal 122 and $V_0$ is the peak voltage reached across C10.

The actual peak value for the voltage on C10 will be slightly lower due to additional circuit capacitance in parallel with C10 and also due to a slight discharge of the power supply bulk capacitor and switching limitations of the microcontroller pin corresponding to the ping start signal 122. For the sake of simplicity, those items can be disregarded due to their negligible contributions.

Figure 2:
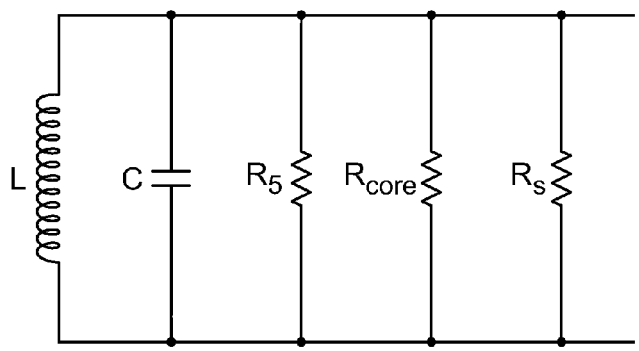
FIG. 2 is an equivalent electrical circuit of a resonant circuit shown in FIG. 1.

The parallel RLC circuit 102 is now unstable and begins to oscillate at a frequency defined by the following equation:

$$f_{osc} = \frac{1}{2 \cdot \pi \cdot \sqrt{L \cdot C}} \quad \text{(Equation 2)}$$

Where $f_{osc}$ is the frequency of oscillation, L is the magnetizing inductance of the secondary winding 103 of the ground fault sensing transformer 104, and C is the value of capacitance in the parallel resonant circuit (capacitor C, in FIG. 2). The value of C in the resonant circuit above is defined by the following equation:

$$C = C_{10} + C_w + \frac{C_9 \cdot C_{13}}{C_9 + C_{13}} \quad \text{(Equation 3)}$$

Where $C_W$ is the capacitance associated with the secondary winding 103 of the ground fault sensing transformer 104.

Due to losses in the resonant circuit, the oscillations will decay as defined by the following equation as a function of time, t:

$$V(t) = V_0 \cdot \sin\left((2 \cdot \pi \cdot f_{osc} \cdot t) + \frac{\pi}{2}\right) \cdot e^{\frac{-t}{2 \cdot R \cdot C}} \quad \text{(Equation 4)}$$

Substituting Equation 2 for $f_{osc}$ gives V(t) in terms of L, R, and C.

$$V(t) = V_0 \cdot \sin\left(\frac{t}{\sqrt{L \cdot C}} + \frac{\pi}{2}\right) * e^{\frac{-t}{2 \cdot R \cdot C}} \quad \text{(Equation 5)}$$

Where $V_0$ is the initial peak voltage across C10, C is the total capacitance in the resonant circuit 102 defined above, and R is the total equivalent value of loss defined as a parallel resistance across the resonant circuit 102. There are three components that make up loss resistance R in the RLC circuit 102: (1) parallel resistance in the input circuit (R5); (2) the core loss of the sensing transformer 104 ($R_{core}$); and (3) primary loop losses, ($R_s$), which as stated above can be essentially ignored. The core loss, $R_{core}$, is the parallel equivalent resistance representing the losses in the core material 504 of the sensing transformer 104. For the frequency range pertinent the operation of this circuit 102, hysteresis losses, defined by the loop area of the B-H curve, dominate the core losses. The primary loop resistance transferred to the secondary winding 103 is a function of the turns ratio squared. Under normal operation, a 1-turn primary in a ground fault sensing application is open or very high impedance. Only during a special case where a grounded-neutral fault exists does the primary loop resistance, $R_s$, become low, represented by the following equation:

$$R_s = R_p \cdot (N_s)^2 \quad \text{(Equation 6)}$$

where $R_s$ is the equivalent parallel resistance on the secondary winding 103 transferred from the primary loop resistance, $R_p$ is the primary loop resistance occurring during a grounded-neutral fault and $N_s$ is the turns ratio (primary number of turns being 1). Note that a grounded neutral fault cannot coexist with load current because the grounded neutral would result in large amounts of load current returning through ground, causing a ground fault to be detected.

The circuit diagram shown in FIG. 2 shows the parallel RLC circuit 102 with all three loss components represented where L is the magnetizing inductance of the secondary winding 103 of the sensing transformer 104, C is the total parallel capacitance in the circuit 100 as defined above and the resistive components are those defined above.

For the sake of the discussion here, $R_s$ can be ignored because a grounded-neutral fault cannot coexist with load current without causing a significant ground fault current which would be detected by the circuit 100 regardless of load current measurement. Plugging the two remaining resistive components ($R_5$ and $R_{core}$) into Equation 5 representing the resonant circuit signal 300 results in the following equation:

$$V(t) = V_0 \cdot \sin\left(\frac{t}{\sqrt{L \cdot C}} + \frac{\pi}{2}\right) \cdot e^{\left(\frac{-t}{2 \cdot R_{core} \cdot C} + \frac{-t}{2 \cdot R_5 \cdot C}\right)} \quad \text{(Equation 7)}$$

Figure 3:
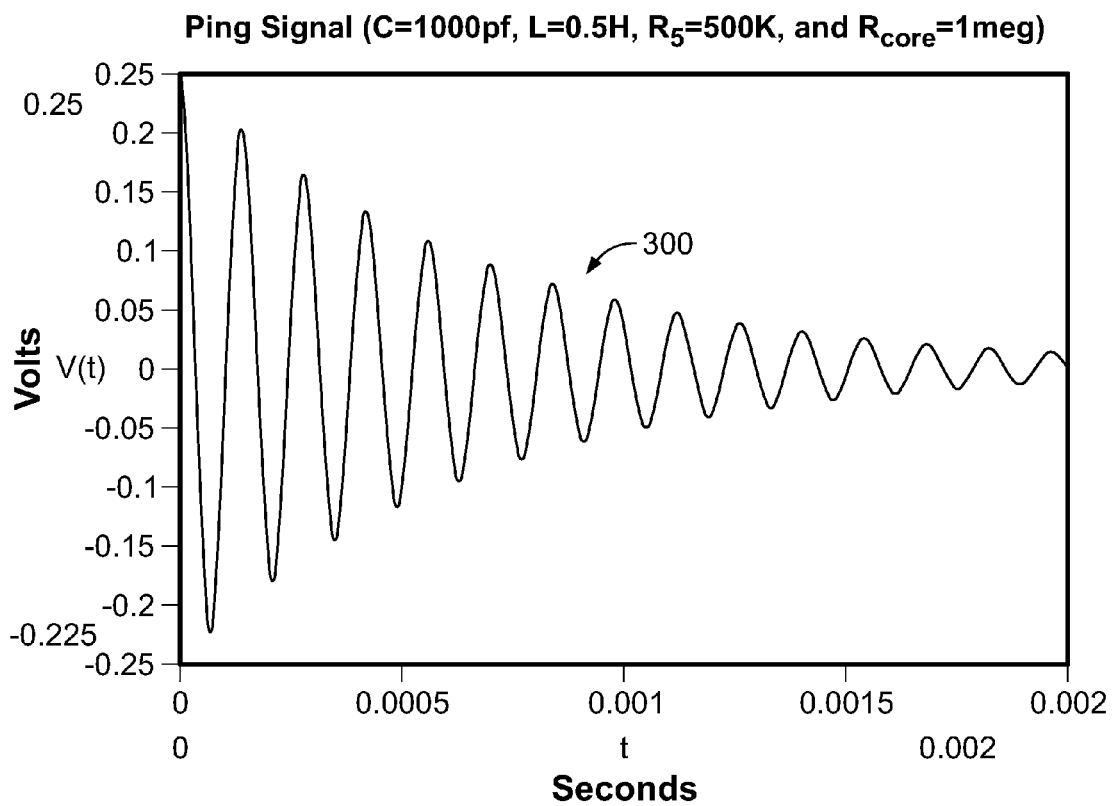
FIG. 3 is an exemplary waveform of an output of the resonant circuit shown in FIG. 1.

For an example of the "ping" waveform, some possible values for L, R, and C are evaluated over a period of time yielding the sampled waveform 300 plotted in FIG. 3 using Equation 7 for V(t).

To determine the amount of core loss ($R_{loss}$) the ping waveform is sampled by the microcontroller 120 such that the resistance value for core loss can be solved. Accordingly, the microcontroller 120 samples the signal at a rate sufficient to determine the peak-to-peak envelope at a point in time after t=0 (the time at which the ping start signal 122 is applied to the circuit 102). The peak-to-peak envelope ($V_{pp}$) for the signal is defined by the equation for V(t) multiplied by 2 with the sin term equal to 1:

$$V_{pp}(t) = 2 \cdot V_0 \cdot e^{-\left(\frac{t}{2 \cdot R_{core} \cdot C} + \frac{t}{2 \cdot R_S \cdot C}\right)} \quad \text{(Equation 8)}$$

The peak-to-peak voltage is used so that any offset in the signal can be ignored.

At a point in time after t=0, the parallel equivalent resistance value for the core loss is calculated in the microcontroller 120 by determining the peak-to-peak envelope voltage of the above signal and solving Equation 8 for $R_{core}$ as shown in Equation 9:

$$R_{core} = \frac{-t}{2 \cdot C \cdot \left[\ln\left(\frac{V_{pp}}{2 \cdot V_0}\right) + \frac{t}{2 \cdot R_S \cdot C}\right]} \quad \text{(Equation 9)}$$

Figure 4:
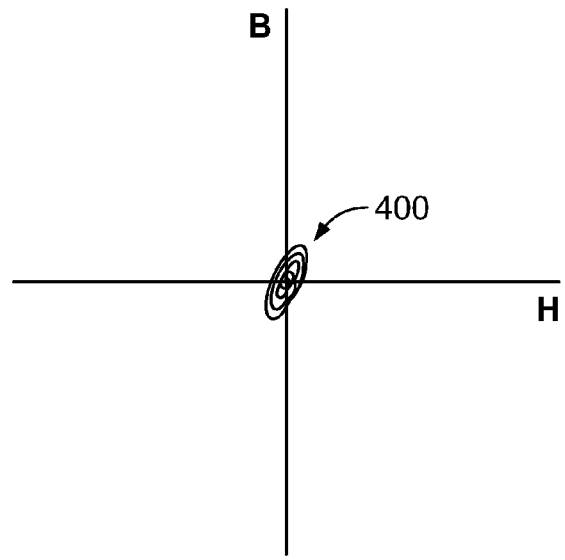
FIG. 4 is an exemplary magnetization (B-H) curve corresponding to a ping under no load conditions.
Figure 5:
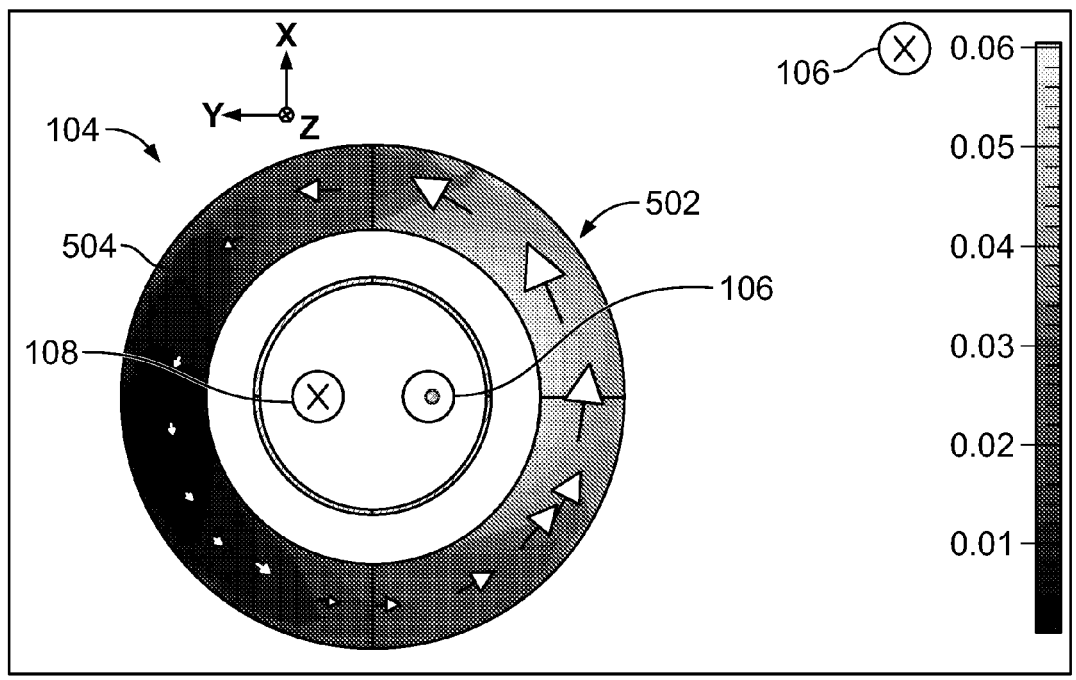
FIG. 5 is an exemplary simulation depicting the magnetic field intensity in a ground fault sensing transformer core material with balanced load current flowing through the center.

The following discussion discloses how the microcontroller 120 determines the load current from the measured core loss component. The resonant circuit signal 300 as discussed above has a voltage and a frequency that generates a very small peak flux density in the core 504 (FIG. 5). Under no load conditions, the resonant circuit signal 300 traces a series of decaying ovals around the origin of the B-H or magnetization curve 400, as shown in FIG. 4. These "normal" losses can be measured and stored by the microcontroller 120 during assembly of the ground fault device when it is assured that no load is present.

When load current is flowing though the fixed wiring 106, 108 that passes through the ground fault sensing transformer 104, the magnetic flux in localized areas of the core is proportional to the load current $I_{load}$. Peak flux densities in certain areas of the core may be much higher than that due to the resonant circuit signal 300. The peak flux density in a ground fault sensing transformer 104 core due to a specific wiring configuration and load current of 60 A is show in this simulation depicted in FIG. 5.

The peak flux density in the upper right-hand section 502 of the core 504 reaches a value of about 0.05 Tesla. In the same core 504 of the sensing transformer 104, the peak flux density due to the resonant circuit signal 300 plotted in the curve 400 shown in FIG. 4 is only about 0.001 Tesla.

The simulation in FIG. 5 shows the magnetic field intensity in a ground fault sensing transformer 104 core material with 60 A of balanced load current flowing through the center. In this configuration, the conductor 106 in the upper right-hand corner represents the return path of the conductor 106 that passes through the transformer 104. This represents an exemplary wiring configuration inside a ground-fault circuit breaker, wherein part of the conductor 106 shown in the upper right hand corner is near enough to the exterior of the transformer 104 to affect the magnetic localized fields in the core 504. The "x" in the conductor 106 conventionally means that the current in the conductor 106 is going into the page (at the upper right corner of FIG. 5), while the "o" means that the current in the conductor 106 is coming out of the page as it passes through the center of the ground fault sensing transformer 104. Flux density in this example reaches 600 Gauss or 0.06 Tesla and is non-uniform. With zero load current and a 5 mA fault current (5 mA through only one conductor in the center of the transformer 104), the flux density is very uniform throughout the core material and only about 10 Gauss or 0.001 Tesla.

The B-H curve 600 illustrated in FIG. 6 shows a much larger trace generated by the localized magnetic field in the core 504 with two smaller B-H curves representing resonant circuit signals 602, 604 superimposed. The oval shape of the B-H curve 600 represents one full cycle of current. The results of the core loss resistance calculation derived from the resonant circuit signal 300 are dependent upon where the B-H curves corresponding to the resonant circuit signals occur on the B-H trace 600 generated by the load current. Different characteristics of core loss at different flux densities for a given core material can be used along with the placement of the core and fixed wiring through the core to determine the amount of load current flowing. The B-H curve corresponding to the resonant circuit signal 602 occurs at a lowest or minimum flux density, whereas the B-H curve corresponding to the resonant circuit signal 604 occurs at a highest or maximum flux density (as determined from the corresponding resonant circuit signals). Either the $R_{core}$ value corresponding to maximum flux density resonant circuit signal (604) or the difference between the two $R_{core}$ values corresponding to the resonant circuit signals (602, 604) can be used, in one of several examples, to calculate the load current, as explained in the next example. By "maximum" flux density, it is meant that one of the B-H curves corresponding to the resonant circuit signals will occur at a highest flux density, and this highest flux density is selected to be the maximum flux density, even though the flux density can be higher at a point on the B-H curve of the core when no ping is applied. Similarly, by "minimum" flux density, it is meant that the lowest flux density is actually 0 T, but one of the B-H curves corresponding to the resonant circuit signals over a cycle of load current will occur at the lowest flux density, and this lowest flux density is selected to be the minimum flux density, even though it may not be 0 T.

The low-flux-density resonant circuit signal (602) will start at some operating point on the much larger oval B-H curve 600 from the load current as shown in FIG. 6. The value for $R_{core}$ that is calculated from the resonant circuit signals 602, 604 represents a value of loss experienced by the resonant circuit 102 at this specific B-H operating point. In the example below, ping #1 (602) occurs when the flux density (B) in the core 504 is nearly 0, and ping #2 (604) represents an operating point of maximum flux density. For core materials such as high permeability ferrites, these two operating points (602, 604) will generate differences in values for $R_{core}$. The magnitude of the difference in $R_{core}$ between these two operating points can be used to represent a specific value of load current. As will be discussed in connection with FIGS. 7A-7C, there is a relationship between the size of the B-H curve and the difference between the maximum and minimum values of $R_{core}$ at the minimum and maximum flux densities. The B-H curve gets larger as the load current increases, and the difference between the maximum and minimum $R_{core}$ values also increases as the load current increases.

FIGS. 7A-7C illustrates three exemplary B-H curves 700, 710, 720 for three increasing levels of load current. The B-H curve 700 in FIG. 7A is superimposed with two curves corresponding to two resonant circuit signals 702, 704 at the points of minimum (0) and maximum flux density. In FIG. 7B, the B-H curve 710 is superimposed with two curves corresponding to two resonant circuit signals 712, 714 at the points of minimum and maximum flux density. As compared to the curves 702, 704, the curves 712, 714 are farther apart, resulting in a larger difference between the respective $R_{core}$ values corresponding to those curves, due to the increase in load current. Finally, in FIG. 7C, the B-H curve 720 is superimposed with two curves corresponding to two resonant circuit signals 722, 724 at the points of minimum and maximum flux density. The difference between the $R_{core}$ value corresponding to the curves 722, 724 is even larger than the $R_{core}$ value corresponding to the curves 712, 714 and the curves 702, 704, because of the higher load current.

An estimate of load current can be obtained by pinging the resonant circuit 102 periodically over a 60 Hz AC (alternating current) load current cycle by exploiting the variations in $R_{core}$. As mentioned above, the large oval represents the B-H trace in a known portion of the core material for a 60 Hz load current. The microcontroller 120 activates the ping start signal 122 resulting in a resonant circuit signal 300 every 1 ms for a total of approximately 16 pings over a single AC load current cycle. The microcontroller 120 calculates an equivalent resistance in the resonant circuit 102 representing core loss ($R_{core}$) for each of the 16 pings or about one ping per millisecond, using the equations referred to above. Each sample of core loss represents the energy lost in the B-H loops generated by the resonant circuit signal 300 at a position on the larger B-H curve. The microcontroller analyzes the variation in the values for $R_{core}$ over a single 60 Hz cycle using an algorithm that determines (1) the $R_{core}$ value at the maximum flux density (in other words, at the point of lowest impedance in a full cycle of AC load current or the worst loss in the cycle), (2) the difference between the $R_{core}$ values corresponding to the minimum and maximum flux densities (as discussed above in connection with FIGS. 7A-7C), (3) a root-mean squared (RMS) value corresponding to the RMS value of the 16 $R_{core}$ values, or (4) some other value that is a function of one or more of the calculated $R_{core}$ values. The amplitude of the variation in $R_{core}$ over the 16 pings will increase with increases in load current (as seen in FIGS. 7A-7C). By performing a similar operation during a production process with known load currents, the microcontroller 120 can be calibrated to equate variations in core loss $R_{core}$ over one AC cycle to a specific value of load current. The calibration process can be eliminated if the application allows for a large enough error budget.

FIG. 8 illustrates a B-H curve 800 of a known portion of the core material for one cycle of a 60 Hz AC load current, and 16 B-H curves 802-830 corresponding to 16 pings in the resonant circuit 102, or about one ping per millisecond, during the cycle. The B-H curve 802 corresponds to the minimum flux density, and the B-H curve 808 corresponds to the maximum flux density. The microcontroller 120 calculates the difference between the corresponding $R_{core}$ values for these two curves 802, 808 in one example to determine the load current from a lookup table or equation characterizing the behavior of known load currents versus $R_{core}$ variations.

As mentioned above, once the $R_{core}$ values have been calculated from Equation 9 over a cycle of load current, the value of the load current can be determined from a lookup table or from an equation or curve that characterizes the relationship between varying load currents and values based on $R_{core}$ variations. For example, referring to FIGS. 7A-7C, each of the B-H curves 700, 710, 720 is associated with an increasing amount of load current. To create the lookup table or equation, known load currents can be applied to the load 114, and the microcontroller 120 pings the resonant circuit 102 and calculates the resulting $R_{core}$ values, and the values based on the $R_{core}$ values are correlated with the corresponding known load currents. By "values based on the $R_{core}$ values," it is meant that the comparison can be made from an $R_{core}$ value at maximum flux density, a difference in $R_{core}$ values at minimum and maximum flux densities, an RMS value of $R_{core}$ values over a full cycle of AC load current, or some other value based on the $R_{core}$ value. Either a table that includes the $R_{core}$-based values and corresponding known load currents can be stored and a relationship defined between the $R_{core}$-based values and known load currents (such as a linear relationship), or a polynomial function can be derived to approximate a curve defined by the $R_{core}$ values at maximum flux density (or $R_{core}$ differences between minimum and maximum flux densities or RMS values over a cycle of AC load current) and known load currents over a range of load currents (e.g., in the pre-saturation region of the transformer 104). The polynomial function can be stored in the memory of the microcontroller 120 and the load current can be calculated by plugging in the $R_{core}$ value into the polynomial function. The resulting load current value can also be stored in the memory of the microcontroller 120 or in a separate conventional memory device (not shown) coupled to the microcontroller.

An advantage of the load-current measurement system disclosed herein is the elimination of an external sensor for measuring load current. The same sensor that is already present for detecting ground faults or grounded-neutral faults can be now used for determining the load current. Another advantage is that the effects of load shift can be reduced or eliminated. Load shift produces a shift (additive or subtractive) in the fault current, which can cause the ground fault circuit breaker to trip at a higher or lower level than expected. Load shift depends on the winding geometries of the transformer and the amount of load current. During calibration of the transformer, as known load currents are applied and associated with the calculated $R_{core}$-based values, any load shift can be compensated for. If the load shift becomes too high, the breaker will no longer meet product requirements. For example, if the microcontroller 120 determines that a calculated load shift of +1 mA is present as compared to the actual known load current supplied, the microcontroller 120 can compensate for the load shift by subtracting 1 mA from the detected fault current value. In this manner, load shift effects can be eliminated, also eliminating variances among transformers due to the inconsistency in winding each transformer uniformly (anything short of a perfect winding will result in variances) and variations in the core material from one transformer to the next.

The calculated load currents can be used for metering applications or for tripping the circuit breaker in response to an excessive level of load current. In metering applications, the load current consumed can be used for revenue calculations or by the consumer to monitor load current usage. Advantageously, a ground fault circuit breaker is now also capable of detecting overcurrents, and the microcontroller 120 can monitor the load currents and send a trip signal to the SCR 132 to cause the circuit breaker to trip in response to the microcontroller 120 determining that the load current exceeds a predetermined threshold.

Any of the algorithms disclosed herein include machine readable instructions for execution by: (a) a processor, (b) a controller, (c) any other suitable processing device, and/or (d) any other suitable machine or device that is specially or particularly programmed or adapted or transformed or configured to execute, carry out, perform, implement, or use the instructions or information representing the instructions of the algorithm. Any algorithm disclosed herein may be embodied in software stored on a tangible medium such as, for example, a flash memory, a CD-ROM, a floppy disk, a hard drive, a digital versatile disk (DVD), or other memory devices, but persons of ordinary skill in the art will readily appreciate that the entire algorithm and/or parts thereof could alternatively be executed by a device or machine other than a controller and/or embodied in firmware or dedicated hardware in a well known manner (e.g., it may be implemented by an application specific integrated circuit (ASIC), a programmable logic device (PLD), a field programmable logic device (FPLD), discrete logic, etc.). Further, although specific algorithms are described with reference to specific diagrams depicted herein, persons of ordinary skill in the art will readily appreciate that many other methods or approaches of implementing the example machine readable instructions can alternatively be used. For example, the order of execution of the algorithms can be changed, and/or some of the functional blocks can be changed, eliminated, or combined. Any intermediate or final result produced by any algorithm herein can be stored in a representative form on a memory device or displayed on a video display. Any method, step, block, or act disclosed herein can be tied to a particular machine or apparatus, such as any of those described above.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A microcontroller-based system for automatically measuring a load current via a ground fault sensing transformer in a circuit to which a load is connected, comprising:
    a resonant circuit that includes a current transformer through which at least two load conductors connected to the load pass, the current transformer having a ferrite core and a secondary winding, the resonant circuit including an output signal responsive to current flow in the load conductors; and
    a microcontroller operatively coupled to the resonant circuit, the microcontroller being programmed to automatically determine a load current consumed by the load by calculating a resistive core loss associated with the ferrite core and a function that includes a value based on the resistive core loss.

2. The system of claim 1, wherein the resonant circuit includes a resistor having a known resistance in parallel with a capacitor having a known capacitance, and wherein the microcontroller is further programmed to output a ping start signal for causing an impulse disturbance in the resonant circuit, the microcontroller calculating the resistive core loss by determining a frequency and rate of decay of the output signal responsive to the impulse disturbance to calculate an inductance associated with the secondary winding, the microcontroller further storing the load current in a memory.

3. The system of claim 2, wherein the microcontroller determines the resistive core loss as a function of the inductance, the known resistance of the resistor, and the known capacitance of the capacitor.

4. The system of claim 3, wherein the function further includes a peak-to-peak envelope voltage of the output signal in response to the ping start signal, and an initial peak voltage across the capacitor.

5. The system of claim 1, wherein the microcontroller is programmed to automatically determine the load current by calculating a second resistive core loss associated with the ferrite core and calculating a difference between the resistive core loss and the second resistive core loss.

6. The system of claim 5, wherein the resistive core loss is calculated in response to a magnetic flux density in the ferrite core being at a minimum over a cycle of the load current and the second resistive core loss is calculated in response to the magnetic flux density in the ferrite core being at a maximum over the cycle of the load current.

7. The system of claim 1, wherein the resistive core loss is calculated by the microcontroller in response to a magnetic flux density in the ferrite core being at a maximum over a cycle of the load current.

8. The system of claim 1, wherein the microcontroller is programmed to automatically determine the load current by calculating a plurality of resistive core losses over a cycle of the load current and calculating a root-mean squared value corresponding to the plurality of resistive core losses.

9. The system of claim 1, wherein the microcontroller is programmed to automatically determine the load current by comparing the value based on the resistive core loss with a known load current and approximating the load current based on the comparison.

10. The system of claim 1, wherein the function is a polynomial function that approximates a behavior of known load currents across a range of resistive core losses, and wherein the polynomial function produces the load current for the resistive core loss provided to the polynomial function.

11. The system of claim 1, wherein the microcontroller is programmed to output a burden control signal that controls whether a burden resistor is connected in parallel with the resonant circuit.

12. The system of claim 11, wherein the burden resistor is connected to a transistor that is operatively coupled to the burden control signal, the burden control signal turning the transistor on or off to connect or disconnect the burden resistor from the circuit.

13. The system of claim 12, wherein the microcontroller is programmed to automatically determine the load current in response to the burden resistor being disconnected from the circuit and to automatically detect a grounded-fault condition via the resonant circuit in response to the burden resistor being connected to the circuit.

14. The system of claim 1, wherein the microcontroller is further programmed to detect a grounded-fault condition via the resonant circuit and a ground fault condition via the current transformer.

15. The system of claim 1, wherein at least one of the load conductors is ungrounded and wherein the resonant circuit and the microcontroller are disposed within a circuit breaker having an electronic switching device for causing the ungrounded load conductor to disconnect from the circuit in response to a trip signal being outputted by the microcontroller.

16. The system of claim 1, wherein the microcontroller outputs the trip signal in response to the load current exceeding a predetermined threshold.

17. A circuit for determining a load current via a sensing transformer, comprising:
    a resonant circuit that includes a current transformer through which at least two load conductors connected to a load pass, the current transformer having a ferrite core and a secondary winding, the resonant circuit including a resistor having a known resistance in parallel with a capacitor having a known capacitance, the resonant circuit producing an output signal responsive to current flow in the load conductors; and a microcontroller operatively coupled to receive the output signal produced by the resonant circuit, the microcontroller being programmed to automatically determine a load current consumed by the load by:

outputting a ping start signal that causes an impulse disturbance in the resonant circuit, determining a characteristic of the output signal responsive to the impulse disturbance to calculate an inductance associated with the secondary winding, calculating a first resistive core loss associated with the ferrite core at a first time as a function of the inductance, the known resistance of the resistor, and the known capacitance of the capacitor, and storing the load current in a memory.

18. The circuit of claim 17, wherein the function further includes a peak-to-peak envelope voltage of the output signal in response to the ping start signal, and an initial peak voltage across the capacitor.

19. The circuit of claim 17, further comprising a burden resistor in parallel with the resonant circuit and a transistor connected to the burden resistor and operatively coupled to the burden control signal, wherein the microcontroller is programmed to output a burden control signal that controls whether the burden resistor is connected in parallel with the resonant circuit by turning the transistor on or off.

20. A microcontroller-based system for automatically determining a load current via a sensing transformer in a circuit to which a load is connected, comprising:

a resonant circuit that includes a current transformer through which at least two load conductors connected to the load pass, the current transformer having a secondary winding, the resonant circuit including an output signal responsive to current flow in the load conductors, the resonant circuit further including a resistor having a known resistance in parallel with a capacitor having a known capacitance; and a microcontroller operatively coupled to the resonant circuit, the microcontroller being programmed to:

automatically determine a load current consumed by the load by calculating a resistive core loss associated with the current transformer, output a ping start signal for causing an impulse disturbance in the resonant circuit, calculate the resistive core loss by determining at least a frequency and rate of decay of the output signal responsive to the impulse disturbance to calculate an inductance associated with the secondary winding, and store the load current in a memory.

21. A system for automatically measuring a load current via a sensing transformer in a circuit to which a load is connected, comprising:

a resonant circuit that includes a current transformer through which at least two load conductors connected to the load pass, the current transformer having a ferrite core and a secondary winding, the resonant circuit including an output signal responsive to current flow in the load conductors; and a microcontroller operatively coupled to the resonant circuit, the microcontroller being programmed to:

automatically determine a load current consumed by the load by calculating a resistive core loss associated with the ferrite core, and automatically determine the load current by comparing a value based on the resistive core loss with a known load current and approximating the load current based on the comparison.

\* \* \* \* \*